(12) United States Patent
Bai et al.

(10) Patent No.: US 8,222,821 B2
(45) Date of Patent: Jul. 17, 2012

(54) PULSE PLASMA MATCHING SYSTEMS AND METHODS INCLUDING IMPEDANCE MATCHING COMPENSATION

(75) Inventors: Keun-Hee Bai, Gyeonggi-do (KR); Yoon-Jae Kim, Seoul (KR); Yong-Jin Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 1057 days.

(21) Appl. No.: 12/145,850

(22) Filed: Jun. 25, 2008

(65) Prior Publication Data

US 2009/0000942 A1    Jan. 1, 2009

(30) Foreign Application Priority Data

Jun. 26, 2007    (KR) .................. 10-2007-0063042

(51) Int. Cl.
*H05B 31/26* (2006.01)
(52) U.S. Cl. .......... 315/111.21; 315/111.51; 315/111.71
(58) Field of Classification Search ............. 315/111.21, 315/111.51, 111.71; 204/164, 298.03; 216/67; 156/345.28
See application file for complete search history.

(56) References Cited

U.S. PATENT DOCUMENTS

| | | | | |
|---|---|---|---|---|
| 5,637,961 A | * | 6/1997 | Ishii et al. ................. | 315/111.51 |
| 5,888,414 A | * | 3/1999 | Collins et al. .................. | 216/68 |
| 6,297,595 B1 | * | 10/2001 | Stimson et al. .......... | 315/111.51 |
| 6,774,570 B2 | | 8/2004 | Tsuchiya et al. | |
| 6,887,339 B1 | * | 5/2005 | Goodman et al. ........ | 156/345.28 |
| 2003/0079983 A1 | * | 5/2003 | Long et al. ..................... | 204/164 |
| 2007/0145900 A1 | * | 6/2007 | Kirchmeier et al. ..... | 315/111.21 |
| 2007/0252529 A1 | * | 11/2007 | Belinger .................. | 315/111.21 |

FOREIGN PATENT DOCUMENTS

| | | |
|---|---|---|
| JP | 08-064393 | 3/1996 |
| JP | H10-64696 | 3/1998 |
| JP | 2006-286306 | 10/2006 |
| KR | 10-2005-0067362 | 7/2005 |

OTHER PUBLICATIONS

Notice of Decision to Grant Patent, May 28, 2009, KR Application No. 10-2007-0063042, 3 pages.

* cited by examiner

*Primary Examiner* — Tung X Le
(74) *Attorney, Agent, or Firm* — Myers Bigel Sibley & Sajovec

(57) ABSTRACT

A pulse plasma matching system includes an RF matching box configured to receive an RF power pulse generated by an RF power source, configured to perform a plasma impedance matching, and configured to apply the RF power pulse to a process chamber, and a network analyzer configured to measure an impedance of plasma generated in a process chamber. A controller is configured to generate a capacitance control signal corresponding to a plasma impedance value measured by the network analyzer, configured to supply the capacitance control signal to the RF matching box, and configured to generate an impedance matching compensation pulse, and a phase shifter is configured to receive the impedance matching compensation pulse and to shift a phase of the impedance matching compensation pulse to synchronize the impedance matching compensation pulse to the RF power pulse.

8 Claims, 9 Drawing Sheets

PULSE PLASMA MATCHING SYSTEMS AND METHODS INCLUDING IMPEDANCE MATCHING COMPENSATION

CROSS REFERENCE TO RELATED APPLICATIONS

This application claims priority under 35 U.S.C. §119 to Korean Patent Application No. 10-2007-0063042, filed on Jun. 26, 2007, the disclosure of which is hereby incorporated by reference in its entirety as if fully set forth herein.

BACKGROUND

The present invention relates to semiconductor fabrication, and more particularly, to pulse plasma matching systems and methods.

In general, the electrical impedance inside a plasma chamber in a semiconductor manufacturing apparatus can be affected by the materials used in the interior of the chamber. In particular, variations in the materials may greatly influence the plasma chamber to which a radio frequency (RF) power source is applied. For example, in a sputtering process using AZO (Al-doped ZnO) as a deposition material, when the AZO corrodes, the impedance of the chamber interior can change. As a result, a process, such as an etching or ashing process, may be changed depending on process conditions, such as the size of processed substrate, the process gases used and/or temperature, etc., of the chamber interior. The most desirable RF matching condition in a plasma chamber system is typically to make an internal impedance of the RF power source about equal to an internal impedance of the chamber. An electricity utilization level can increase by using an RF matching box in order to obtain an impedance matching between the RF power source and an electrode of the chamber.

A plasma process uses RF power. It can therefore be desirable to suppress reflective power. To reduce reflective power, a matching system including a variable capacitor and a coil can be used between an RF generator and a load, such as a plasma chamber. Most matching systems include a variable vacuum capacitor and a fixed coil, and realize power matching by using an algorithm that substantially reduces reflective power through the variable vacuum capacitor. A typical matching method uses an algorithm that searches for a point where reflective power is substantially reduced by controlling the capacitance of the variable vacuum capacitor when the reflective power is more than a reference level.

A power pulse operation method can enlarge a process area and/or increase process margins compared to continuous wave methods. The power pulse operation can obtain a high selection rate as compared with continuous wave methods, and also can solve or improve problems, such as charging damage, UV radiation, and/or physical sputtering that can be caused in plasma processes. Thus, the use of the power pulse operation has increased.

A conventional semiconductor manufacturing apparatus for matching impedance using a matching box is shown in FIG. 1.

Referring to FIG. 1, a chamber 30 ionizes gas using applied RF power that is matched through an RF matching box 60, and generates a plasma for use in performing a semiconductor manufacturing process. A power detector 40 detects a level of RF power supplied to the chamber 30 and applies it to a tuning controller 50. The tuning controller 50 monitors RF power consumed inside the chamber 30 in response to a feedback signal from the power detector 40, and processes a monitoring value according to a predetermined algorithm to maintain the RF power at a constant level, and also controls an impedance match between an RF power source 20 and the chamber 30. The RF power source 20 receives a control signal from the tuning controller 50 and generates RF power in response to the control signal. The RF matching box 60 matches impedance between the RF power source 20 and the chamber 30.

A configuration of the RF matching box 60 to match impedance between the RF power source 20 and the chamber 30 is shown in FIG. 2.

With reference to FIG. 2, the RF matching box 60 includes a power supplier 61 that supplies power to first and second motors M1 and M2. A controller 63 is coupled to the first and second motors M1 and M2. Rotational power from the first and second motors is transmitted through a plurality of gears 62 to a first variable capacitor C1, and a second variable capacitor C2. A peak voltage detector 64 is coupled to the second variable capacitor C2 through an inductor L1. A resistor R1 is also coupled to the inductor L1. RF power is output by the matching box 60 from the peak voltage detector 64. A DC voltage on the resistor R1 is supplied to the controller 63.

The power supplier 61 receives AC input power and responsively outputs a direct current voltage of 24V. The first and second motors M1 and M2 receive direct current (DC) voltage from the power supplier 61, and rotate clockwise or counterclockwise in response to a motor drive control signal from the controller 63. The controller 63 controls the first and second motors M1 and M2 in response to a peak voltage detected by the peak voltage detector 64. The plurality of gears 62 transfer rotary power from the motors M1, M2 to the first variable capacitor C1 and the second variable capacitor C2. The first variable capacitor C1 is exposed to air and is used for a coarse control. The first variable capacitor C1 includes a control knob that rotates in response to power transferred through the plurality of respective gears 62. The second variable capacitor C2 is exposed in a vacuum state, and performs a fine control. The second variable capacitor C2 includes a control knob that rotates in response to power transferred through the plurality of respective gears 62. The inductor L1 reduces/eliminates a direct current component of RF power output from the second variable capacitor C2. The resistor R1 is coupled to the inductor L1, and is used to detect a direct current bias voltage. The peak voltage detector 64 detects a peak voltage of RF power matched for impedance through the inductor L1.

In a continuous wave plasma shown in FIG. 3 using an RF power matching system as described above, a stabilized power match is possible, because there may not be a significant time delay in the feedback loop and/or the plasma may not change greatly during the feedback loop from time t1 to time t4, as shown in FIG. 4A. As shown in FIG. 4A, feedback is provided to the RF source 20 beginning at time t1. The adjusted power output from the RF power source 20 is provided to the matching box 60 beginning at time t2. The matched RF power is provided to the plasma chamber 30 beginning at time t3. At time t4, the state of the plasma in the chamber 30 changes in response to the adjusted power level.

However, in a pulse plasma system there may be a time delay in the feedback loop during which the state of the plasma can change, as shown in FIG. 4B. Thus, reflective power can be generated in a pulse plasma system, which may be an important factor limiting the use of pulse plasma system/methods. In applying a pulse plasma, it can be difficult to perform power matching because, while a feedback value is given from the chamber 30 to the RF power source 20 at a time point t1, RF power is provided from the RF power source 20 to the RF matching box 60 at a time point t2, and an RF power pulse matched for an impedance is given from the matching box 60 to the chamber 30 at a time point t3. Thus, a time delay of t4-t1 may be present in the feedback loop, as illustrated in FIG. 4B.

In a continuous wave plasma, a level of state change of the plasma during the feedback loop may not be great, so that a feedback value received from the matching box 60 can be effective even when a time delay is generated at t1 to t4 as shown in FIG. 4A. However, in a pulse plasma, a level of state change of the plasma from t1 to t4 can be large. Thus, a phase of RF power value given from the matching box 60 to the chamber 30 can be distorted due to time delay in the feedback loop, which can generate reflective power that can cause process errors.

SUMMARY

A pulse plasma matching system according to some embodiments includes an RF matching box configured to receive an RF power pulse generated by an RF power source, configured to perform a plasma impedance matching, and configured to apply the RF power pulse to a process chamber, a network analyzer configured to measure an impedance of plasma generated in a process chamber, a controller configured to generate a capacitance control signal corresponding to a plasma impedance value measured by the network analyzer, configured to supply the capacitance control signal to the RF matching box, and configured to generate an impedance matching compensation pulse, and a phase shifter configured to receive the impedance matching compensation pulse and to shift a phase of the impedance matching compensation pulse to synchronize the impedance matching compensation pulse to the RF power pulse.

The system may further include a memory coupled to the controller and configured to store a program for a desired plasma impedance matching, an impedance matching compensation pulse and a capacitance value for a desired pulse plasma impedance matching.

The RF matching box may include a power supplier configured to receive an AC power and to output a direct current voltage in response to the AC power, first and second motors configured to receive the direct current voltage supplied by the power supply unit, and to be driven in response to a motor drive control signal from the controller, a first variable capacitor for coarse impedance control, including a control knob rotatable in response to power transferred form the first motor, a second variable capacitor for fine impedance control, including a control knob rotatable in response to power transferred from the second motor, an inductor coupled to the second variable capacitor and configured to reduce a direct current component of RF power output by the second variable capacitor, and a resistor coupled to the inductor and configured to detect a direct current bias voltage in the RF power output by the second variable capacitor.

A pulse plasma matching system according to some embodiments includes a reflective power measurer configured to measure reflective power in an RF power pulse generated by an RF power source, an RF matching box configured to receive the RF power pulse, to perform a plasma impedance matching, and to apply RF power to a process chamber in response to the RF power pulse, a phase shifter configured to shift a phase of an impedance matching compensation pulse to synchronize the impedance matching pulse to the RF power pulse, a network analyzer configured to measure an impedance of plasma generated in the process chamber, and a controller configured to generate an impedance matching compensation pulse and a capacitance control signal to reduce reflective power in the RF power pulse in response to the reflective power value measured by the reflective power measurer and/or in response to a plasma impedance value measured by the network analyzer.

The system may further include a memory coupled to the controller and configured to store a program for a desired plasma impedance matching, the impedance matching compensation pulse and a capacitance value corresponding to a desired pulse plasma impedance matching.

Methods according to some embodiments include generating a pulse plasma for a process in response to an RF power pulse, measuring an impedance of the generated pulse plasma, generating an impedance matching compensation pulse and a capacitance control value in response to the measured impedance value of the pulse plasma, shifting a phase of the impedance matching compensation pulse to synchronize the impedance matching compensation pulse to a phase of the RF power pulse, and matching an impedance of the shifted impedance matching compensation pulse using the capacitance control value.

The methods may further include measuring reflective power in the RF power pulse, shifting a phase of the impedance matching compensation pulse corresponding to the measured reflective power so as to synchronize the impedance matching compensation pulse to the RF power pulse, reducing reflective power in the shifted impedance matching compensation pulse, and outputting the shifted impedance matching compensation pulse.

Methods according to further embodiments can include generating a pulse plasma for a process in response to an RF power pulse, measuring an impedance of the generated pulse plasma, generating an impedance matching compensation pulse and a capacitance control value in response to the measured impedance of the pulse plasma, and shifting a phase of the impedance matching compensation pulse so as to synchronize the impedance matching compensation pulse to a phase of the RF power pulse during a period in which the pulse plasma continues to be changed in one cycle of the pulse plasma, and matching an impedance of the shifted impedance matching compensation pulse using the capacitance control value.

BRIEF DESCRIPTION OF THE DRAWINGS

The above and other features of some embodiments of the invention will become readily apparent from the description that follows, with reference to the attached drawings in which.

DETAILED DESCRIPTION

Embodiments of the present invention now will be described more fully hereinafter with reference to FIGS. 5 to 8, in which embodiments of the invention are shown. This invention may, however, be embodied in many different forms and should not be construed as limited to the embodiments set forth herein. Rather these embodiments are provided so that this disclosure will be thorough and complete, and will fully convey the scope of the invention to those skilled in the art.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein. Exemplary embodiments of the present invention are more fully described below with reference to FIGS. 5 to 8. This invention may, however, be embodied in many different forms and should not be construed as being limited to the exemplary embodiments set forth herein; rather, these exemplary embodiments are provided so that this disclosure is thorough and complete, and conveys the concept of the invention to those skilled in the art.

Figure 1:
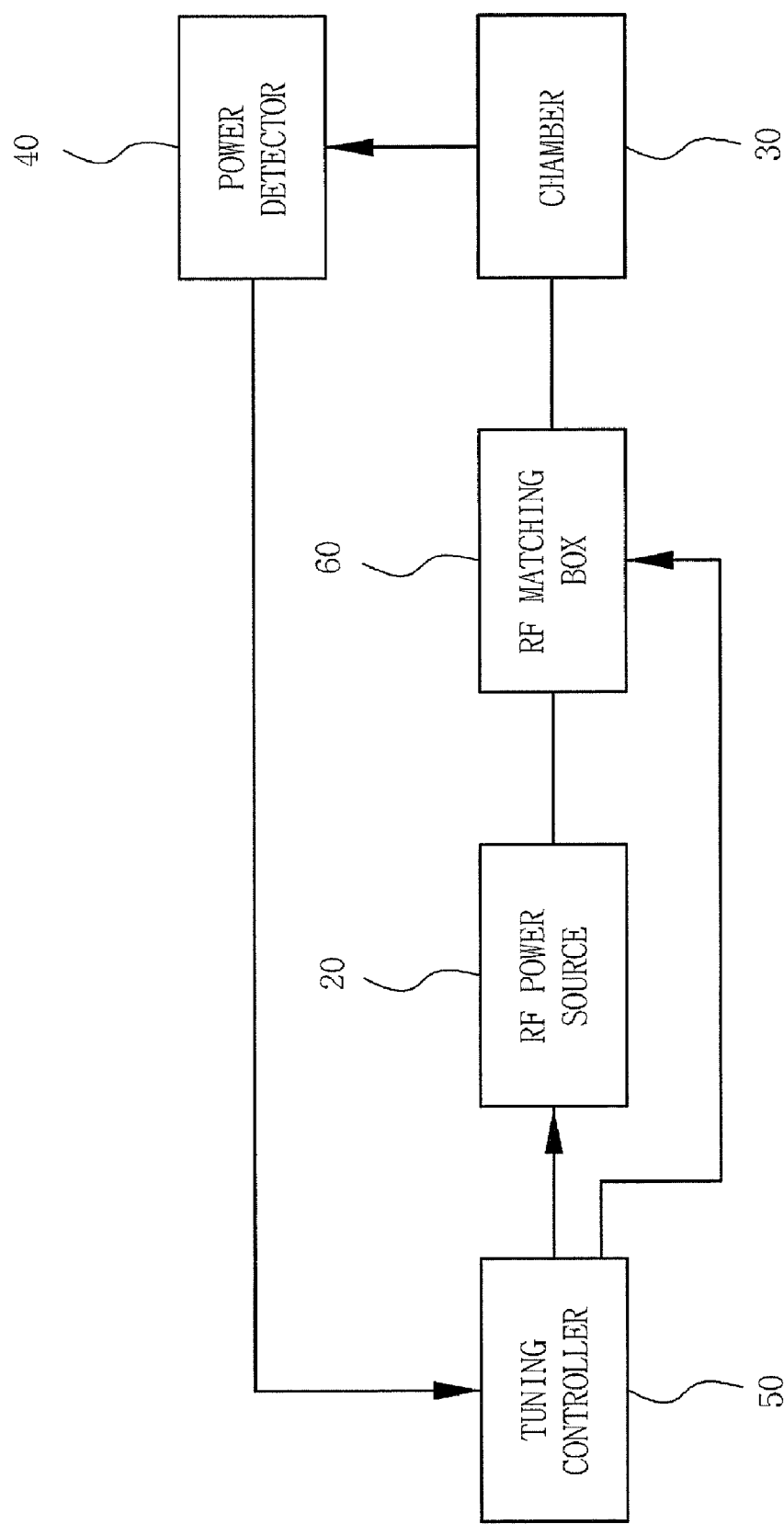
FIG. 1 is a block diagram of a conventional semiconductor manufacturing apparatus for performing an impedance matching using an RF matching box.
Figure 2:
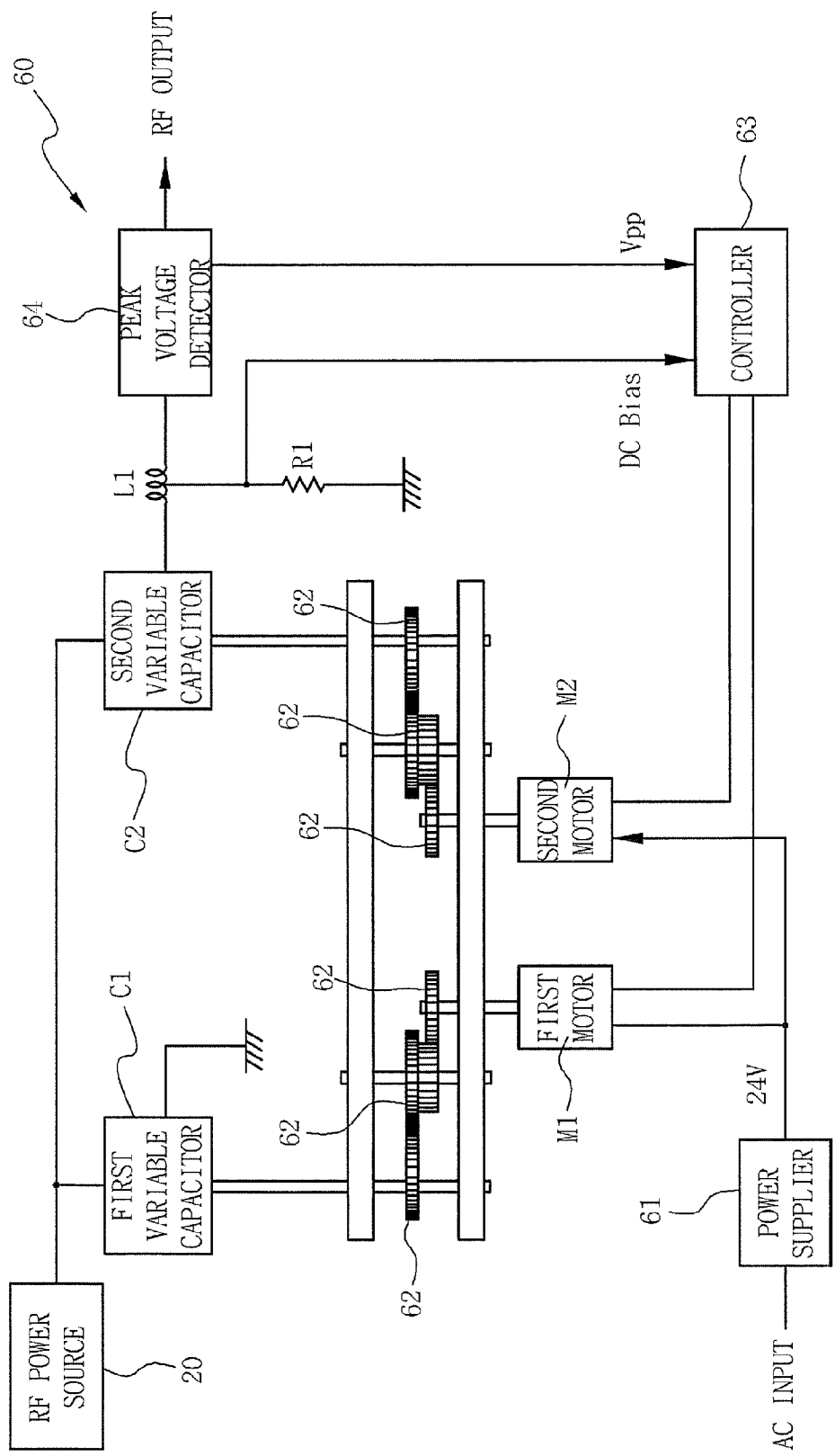
FIG. 2 is a block diagram of a conventional RF matching box for controlling an impedance matching between an RF power source and a chamber.
Figure 3:
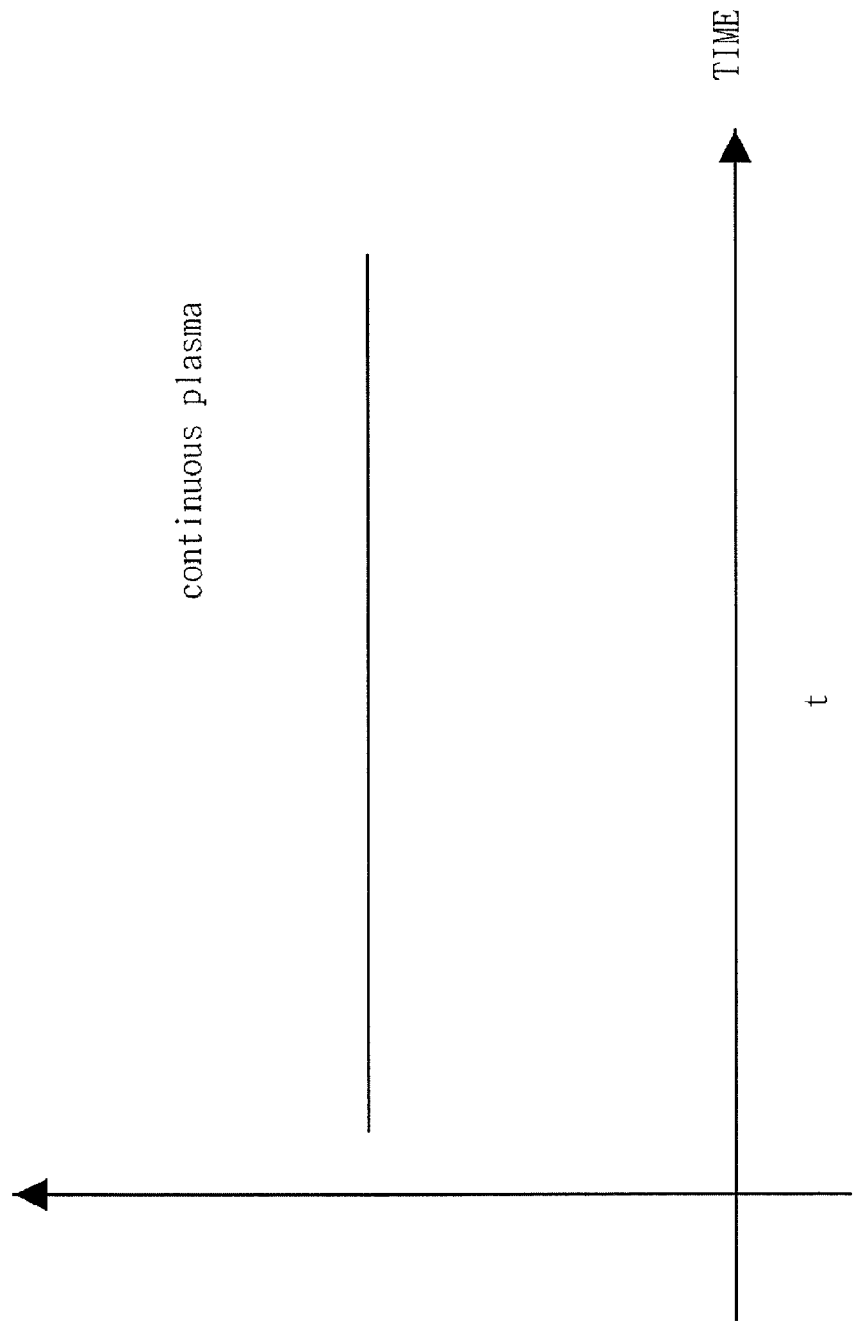
FIG. 3 illustrates a state of a continuous wave plasma.
Figure 4A:
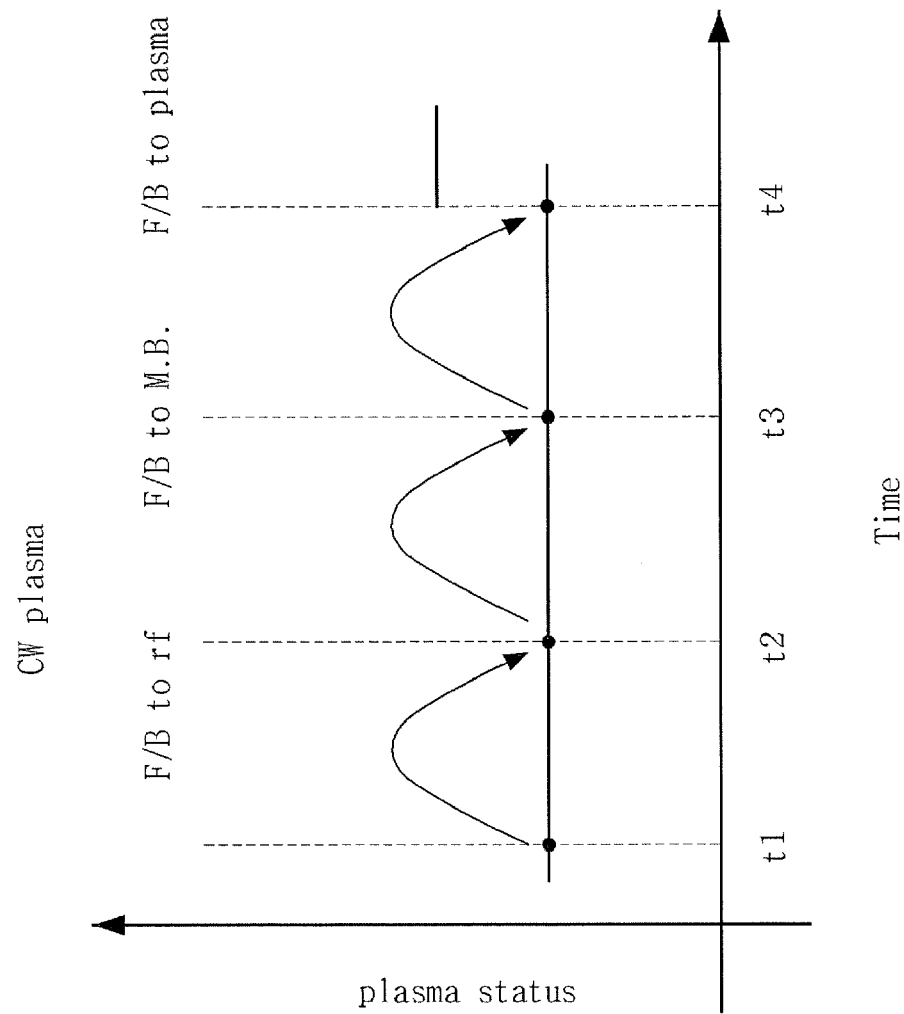
FIG. 4A illustrates a change of a continuous wave plasma in response to feedback.
Figure 4B:
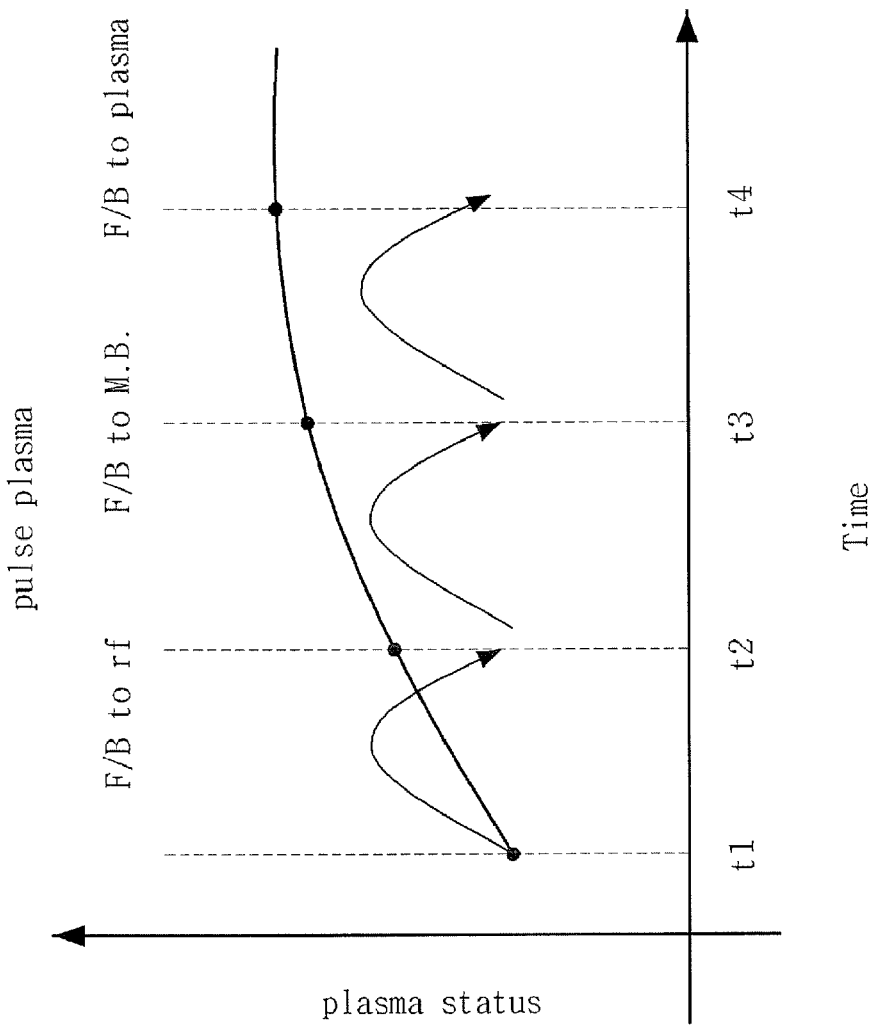
FIG. 4B illustrates a change of a pulse plasma in response to feedback.
Figure 5:
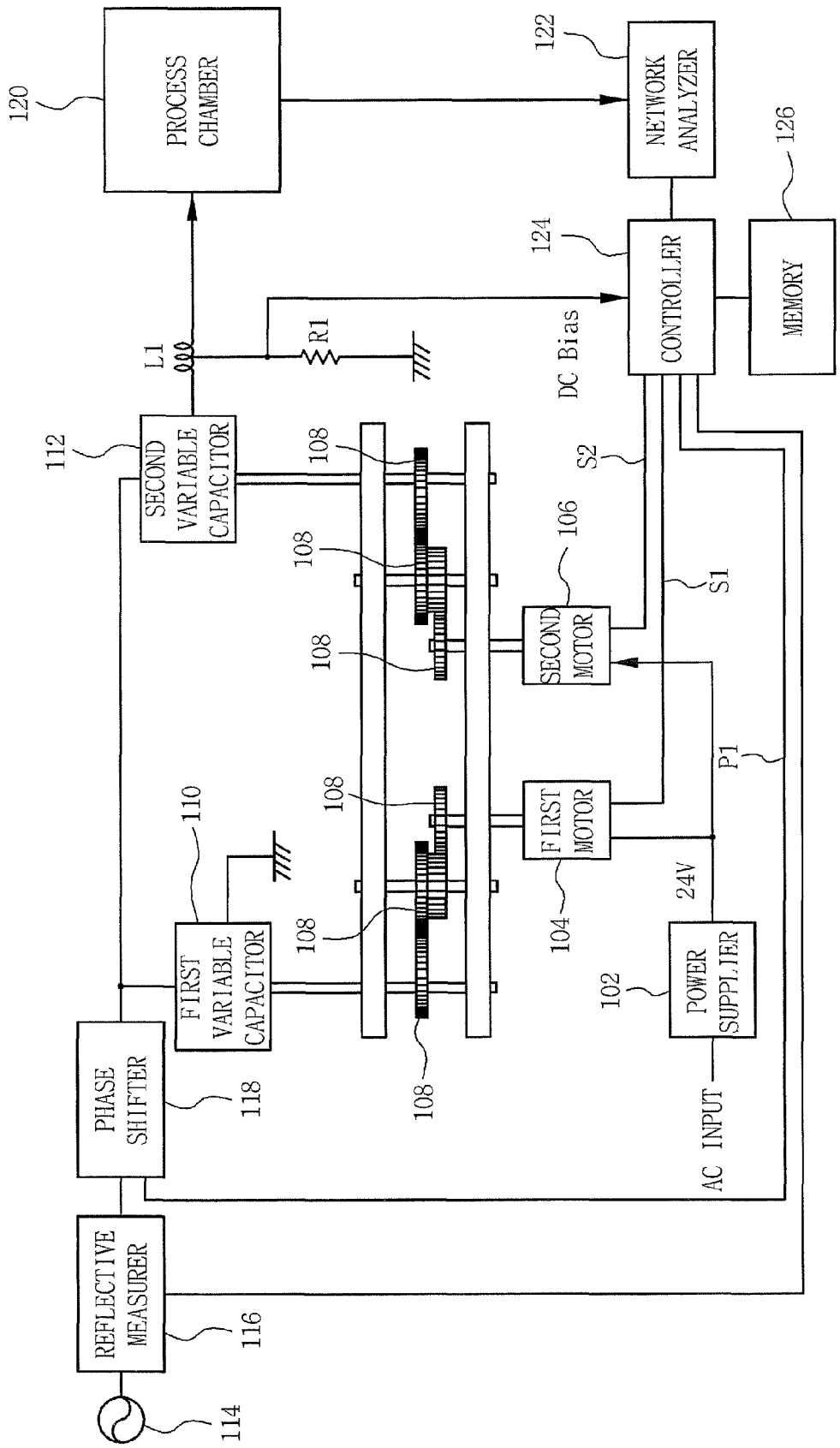
FIG. 5 is a block diagram of RF power matching system according to some embodiments.

FIG. 5 is a block diagram of an RF power matching system according to some embodiments. The RF power matching system matches RF power supplied by an RF power source 114 to a process chamber 120. The process chamber 120 receives RF power that is matched for an impedance, generates a pulse plasma in response to the RF power, and performs the process.

An RF power matching system according to some embodiments can be provided with the following configuration. A power supplier 102 receives an AC power, and responsively outputs a direct current (DC) voltage of, for example, 24V.

First and second motors 104 and 106 receive the direct current voltage supplied from the power supplier 102 and rotate clockwise or counterclockwise in response to a motor drive control signal from a controller 124.

A plurality of gears 108 transfers rotary power from the first and second motors 104 and 106 to a first variable capacitor 110 and a second variable capacitor 112. The a first variable capacitor 110 is used for coarse control, and includes a control knob that rotates in response to power transferred through the plurality of gears 108. The second variable capacitor 112 is used for fine control, and includes a control knob that rotates in response to power transferred through the plurality of gears 108.

An inductor L1 reduces/eliminates a direct current component of RF power output by the second variable capacitor 112.

A resistor R1 is connected to the inductor L1, and is used to detect a direct current (DC) bias voltage in the output signal supplied to the process chamber 120.

A reflective power measurer 116 measures a reflection power of RF power supplied from the RF power source 114.

A phase shifter 118 synchronizes a given impedance matching compensation pulse to an RF power pulse generated in the RF power source 114 by shifting a phase of the impedance matching compensation pulse.

A network analyzer 122 measures an impedance for the plasma generated in the process chamber 120.

The controller 124 generates an impedance matching compensation pulse and a drive control signal for the first and second motors 104 and 106. The impedance matching compensation pulse and the drive control signal are used to control the capacitances of the first and second variable capacitors 110, 112 to provide for capacitance control that reduces/removes reflective power from the RF power supplied by the RF power source 114. The impedance matching compensation pulse and the drive control signal are output by the controller 124 in response to a reflective power value measured by the reflective power measurer 116 and/or in response to a plasma impedance value measured by the network analyzer 122. Further, the impedance matching compensation pulse can be used to change the phase of the RF power output from the RF power source 114.

A memory 126 is connected to the controller 124, and is configured to store a program for a desired plasma impedance matching algorithm. The memory can also store appropriate values for an impedance matching compensation pulse and/or a capacitance value computed for a desired pulse plasma impedance matching.

The network analyzer 122 may be realized with an available network analyzer, such as model number N4430A or N4395A or 4395A-010-1D5-1D6 manufactured by Agilent Technologies, Santa Clara, Calif., USA.

Although the memory 126 is illustrated in FIG. 5 as a separate component from the controller 124, the memory may be built into the controller 124 in some embodiments.

Figure 6:
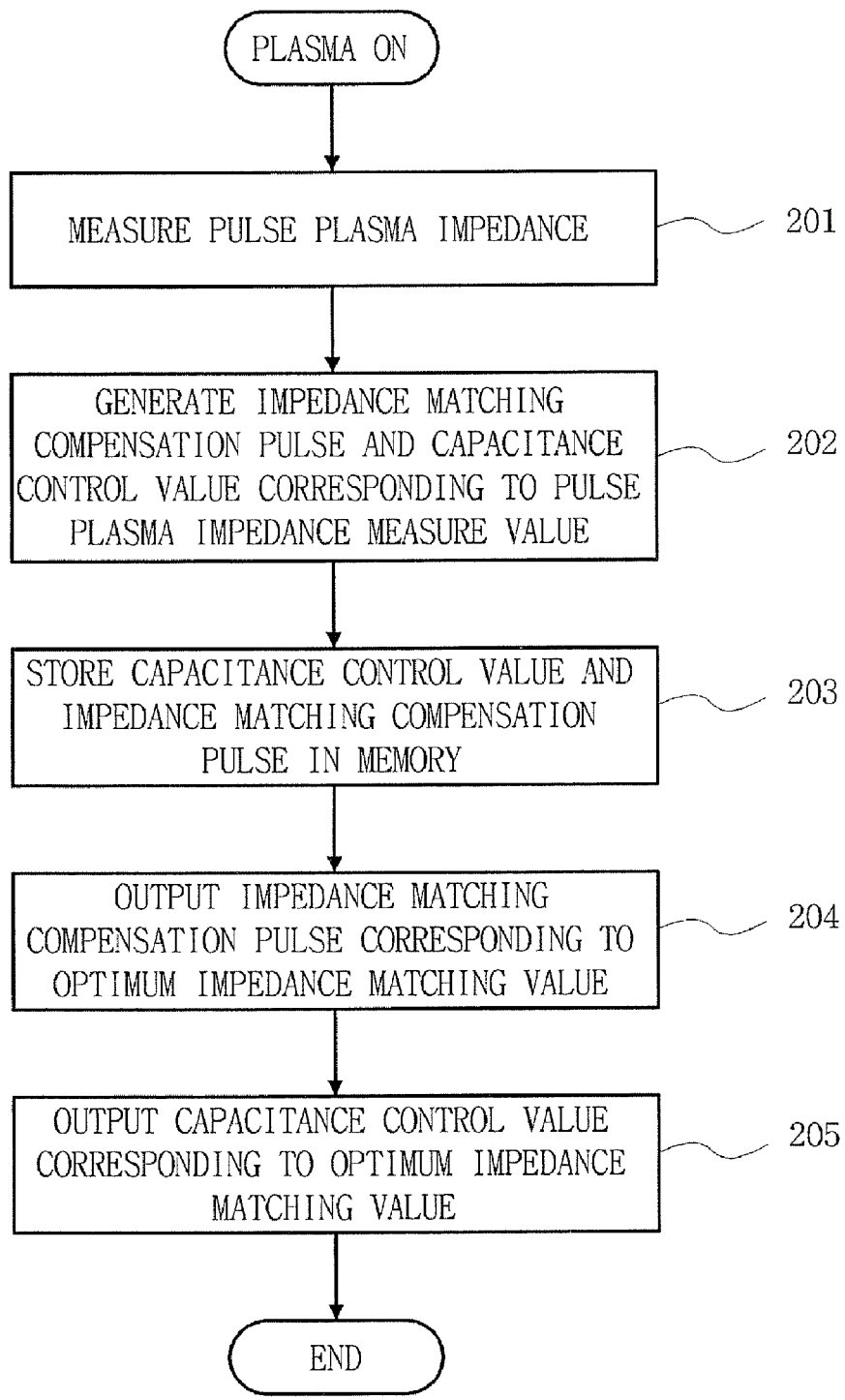
FIG. 6 is a flowchart for a pulse plasma impedance matching according to some embodiments.

FIG. 6 is a flowchart illustrating systems/methods for pulse plasma impedance matching according to some embodiments.

Figure 7:
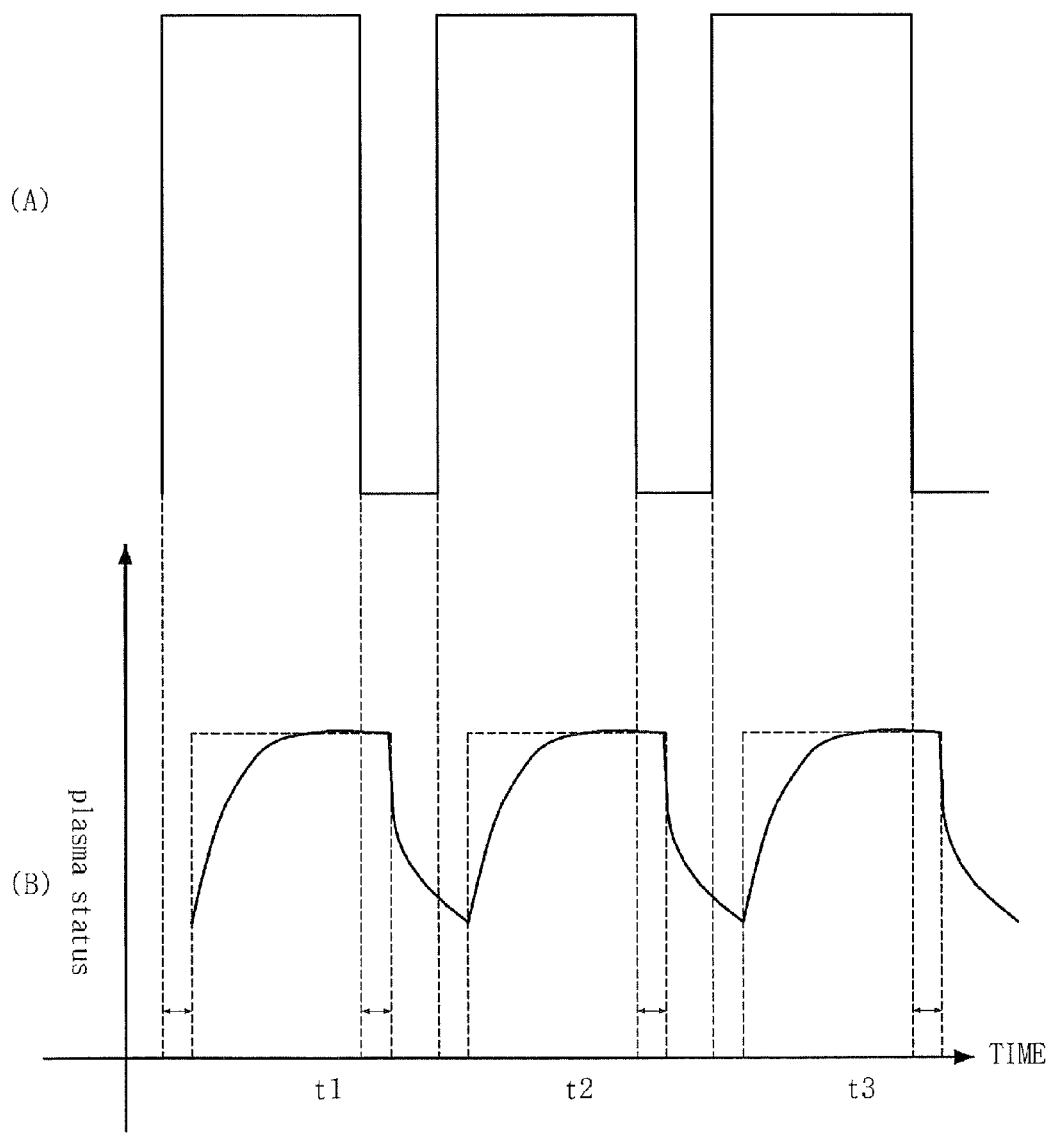
FIG. 7 illustrates waveforms of pulse plasma that are asynchronous to an RF power pulse according to some embodiments.

FIG. 7 illustrates waveforms of a pulse plasma that is asynchronous to an RF power pulse according to some embodiments.

Figure 8:
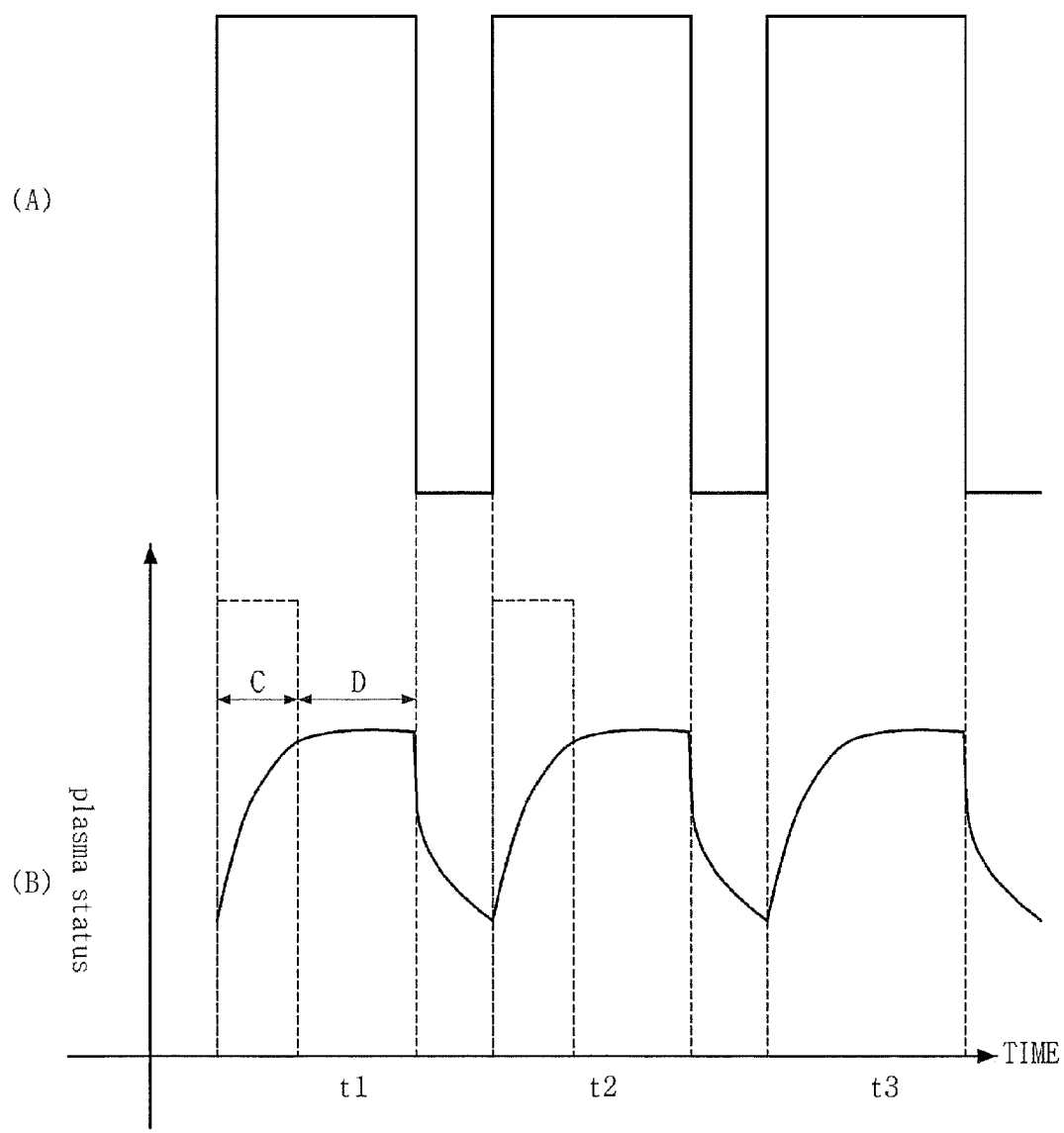
FIG. 8 illustrates waveforms of pulse plasma that are synchronous to an RF power pulse according to some embodiments.

FIG. 8 illustrates waveforms of a pulse plasma that is synchronous to an RF power pulse according to some embodiments.

Operations according to some embodiments are described as follows, referring to FIGS. 5 through 8.

The power supplier 102 receives AC power and responsively outputs a direct current voltage of, for example, 24V. First and second motors 104 and 106 receive the direct current voltage supplied from the power supplier 102 and rotate clockwise or counterclockwise in response to a motor drive control signal from the controller 124. The controller 124 outputs a drive control signal for the first and second motors 104 and 106 to perform capacitance control to reduce/remove reflective power from the RF output signal in response to a reflective power value measured by reflective power measurer 116. The first and second motors 104 and 106 rotate a plurality of gears 108 in response to a motor drive control signal from the controller 124. The plurality of gears 108 transfer rotary power from the first and second motors 104 and 106 to first and second variable capacitors 110 and 112, to thereby control the impedance of the first and second variable capacitors 110 and 112.

The first variable capacitor 110 is exposed to air, and is used for coarse control. The first variable capacitor 110 includes a control knob that rotates in response to power transferred through the plurality of gears 108. The second variable capacitor 112 is exposed to a vacuum state, and is used to perform fine control by rotating a control knob in response to power transferred through the plurality of gears 108.

The inductor L1 reduces/removes a direct current component of RF power output from the second variable capacitor 112. The resistor R1 is connected to the inductor L1 and is used to detect a direct current bias voltage in the output signal. The detected DC bias voltage is supplied to the controller 124.

RF power matched for impedance through the inductor L1 is supplied to process chamber 120. The process chamber 120 receives the RF power and responsively generates a pulse plasma that can be used in a semiconductor manufacturing process.

During operation of the semiconductor manufacturing process in the process chamber 120, the network analyzer 122 measures an impedance of the pulse plasma formed in the process chamber 120, and provides the impedance measurement to the controller 124. The controller 124 outputs an impedance matching compensation pulse P1 to the phase shifter 118 for an impedance matching and outputs drive control signals S1 and S2 to the first and second motors 104 and 106, respectively, for capacitance control in response to a plasma impedance value measured by the network analyzer 122. The phase shifter 118 performs a phase shift so that a phase of the impedance matching compensation pulse, such as pulse B of FIG. 7, output from the controller 124 is synchronized to an RF pulse, shown as pulse A of FIG. 7, output from the RF source 114. At this time, the controller 124 applies a motor drive signals S1, S2, to the first and second motors 104 and 106 to obtain a desired impedance matching in response to the measured impedance. The motor drive signals S1 and S2 control a capacitance value of the first and second variable capacitors 110, 112, to thereby obtain a desired impedance matching.

Operations of the controller 124 for pulse plasma impedance matching according to some embodiments are described as follows, with reference to the diagram of FIG. 5 and the flowchart of FIG. 6.

The process chamber 120 is placed in a "plasma on" state. Then, the network analyzer 122 measures an impedance of a pulse plasma formed in the process chamber 120 and supplies the measured impedance to controller 124 (Block 201). At Block 202, the controller 124 generates an impedance matching compensation pulse and a capacitance control value corresponding to a desired impedance matching in response to the pulse plasma impedance value measured by the network analyzer 122. At Block 203, the controller 124 stores the generated capacitance control value and impedance matching compensation pulse in the memory 126.

At Block 204, the controller 124 outputs the impedance matching compensation pulse corresponding to the desired impedance matching value. The phase shifter 118 performs a phase shift operation so that a phase of the impedance matching compensation pulse output from the controller 124 is synchronized to an RF power pulse provided through the reflective power measurer 116.

At Block 205, the controller 124 outputs a capacitance control value corresponding to a desired impedance matching value and applies it to the first and second motors 104 and 106. The phase shifter 118 performs a phase shift so that a phase of the impedance matching compensation pulse, such as pulse B of FIG. 7, output from the controller 124 is synchronized to an RF power pulse, such as pulse A of FIG. 7. The controller 124 drives the first and second motors 104 and 106, and thereby controls the capacitance values of the first and second variable capacitors 110 and 112. The impedance matching compensation pulse shifted by the phase shifter 118 undergoes an impedance matching in response to the controlled capacitance value and is thereby converted into a signal, such as signal B of FIG. 8. That is, the RF power pulse applied to the process chamber 120 is controlled by the capacitance value of the first and second variable capacitors 110 and 112, and a phase thereof is synchronized to an RF power pulse, such as pulse A of FIG. 8, generated in the RF power source 114, and is converted into a pulse plasma generation signal, such as signal B of FIG. 8. Thus, an impedance of the pulse plasma can be improved.

Furthermore, it is possible to previously measure and input a matching value for a period C that a plasma impedance continues to be changed in one period of t1 referred to FIG. 8, or to measure a plasma impedance for one period of t1 and determine a desired impedance, and then to program and match an impedance for its subsequent period t2, according to some embodiments.

On the other hand, an impedance matching method according to embodiments of the invention may be used during the period C in which plasma continues to be changed in the period t1 of FIG. 8, and a conventional matching method may be used during a period D in which there is little or no change of the plasma.

As described above, according to some embodiments of the invention, a phase of an impedance matching compensation pulse is shifted to be synchronized with an RF power pulse in the generation of a pulse plasma in a semiconductor manufacturing apparatus. As a result, an impedance of the pulse plasma may be matched to reduce/prevent process errors caused by reflective power resulting from time delay in a feedback loop of the impedance matching system.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A pulse plasma matching system, comprising:
    an RF matching box configured to receive an RF power pulse generated by an RF power source, configured to perform a plasma impedance matching, and configured to apply the RF power pulse to a process chamber;
    a network analyzer configured to measure an impedance of plasma generated in a process chamber;
    a controller configured to generate a capacitance control signal corresponding to a plasma impedance value measured by the network analyzer, configured to supply the capacitance control signal to the RF matching box, and configured to generate an impedance matching compensation pulse; and
    a phase shifter configured to receive the impedance matching compensation pulse and to shift a phase of the impedance matching compensation pulse to synchronize the impedance matching compensation pulse to the RF power pulse.

2. The system of claim 1, further comprising a memory coupled to the controller and configured to store a program for a desired plasma impedance matching, an impedance matching compensation pulse and a capacitance value for a desired pulse plasma impedance matching.

3. The system of claim 2, wherein the RF matching box comprises:
    a power supplier configured to receive an AC power and to output a direct current voltage in response to the AC power;
    first and second motors configured to receive the direct current voltage supplied by the power supply unit, and configured to be driven in response to a motor drive control signal from the controller;
    a first variable capacitor configured to provide coarse impedance control, including a control knob rotatable in response to power transferred from the first motor;

a second variable capacitor configured to provide fine impedance control, including a control knob rotatable in response to power transferred from the second motor;

an inductor coupled to the second variable capacitor and configured to reduce a direct current component of RF power output by the second variable capacitor; and a resistor coupled to the inductor and configured to detect a direct current bias voltage in the RF power output by the second variable capacitor.

4. A pulse plasma matching system, comprising:

a reflective power measurer configured to measure reflective power in an RF power pulse generated by an RF power source;

an RF matching box configured to receive the RF power pulse, to perform a plasma impedance matching, and to apply RF power to a process chamber in response to the RF power pulse;

a phase shifter configured to shift a phase of an impedance matching compensation pulse to synchronize the impedance matching pulse to the RF power pulse;

a network analyzer configured to measure an impedance of plasma generated in the process chamber; and a controller configured to generate an impedance matching compensation pulse and a capacitance control signal to reduce reflective power in the RF power pulse in response to the reflective power value measured by the reflective power measurer and in response to a plasma impedance value measured by the network analyzer.

5. The system of claim 4, further comprising a memory coupled to the controller and configured to store a program for a desired plasma impedance matching, the impedance matching compensation pulse and a capacitance value corresponding to a desired pulse plasma impedance matching.

6. A method comprising:

generating a pulse plasma for a process in response to an RF power pulse;

measuring an impedance of the generated pulse plasma;

generating an impedance matching compensation pulse and a capacitance control value in response to the measured impedance value of the pulse plasma;

shifting a phase of the impedance matching compensation pulse to synchronize the impedance matching compensation pulse to a phase of the RF power pulse; and matching an impedance of the shifted impedance matching compensation pulse using the capacitance control value.

7. The method of claim 6, further comprising:

measuring reflective power in the RF power pulse;

shifting a phase of the impedance matching compensation pulse corresponding to the measured reflective power so as to synchronize the impedance matching compensation pulse to the RF power pulse;

reducing reflective power in the shifted impedance matching compensation pulse; and outputting the shifted impedance matching compensation pulse.

8. A method comprising:

generating a pulse plasma for a process in response to an RF power pulse;

measuring an impedance of the generated pulse plasma;

generating an impedance matching compensation pulse and a capacitance control value in response to the measured impedance of the pulse plasma; and shifting a phase of the impedance matching compensation pulse so as to synchronize the impedance matching compensation pulse to a phase of the RF power pulse during a period in which the pulse plasma continues to be changed in one cycle of the pulse plasma, and matching an impedance of the shifted impedance matching compensation pulse using the capacitance control value.

* * * * *